United States Patent [19]

Hoenk et al.

[11] Patent Number: 5,316,586
[45] Date of Patent: May 31, 1994

[54] SILICON SAMPLE HOLDER FOR MOLECULAR BEAM EPITAXY ON PRE-FABRICATED INTEGRATED CIRCUITS

[75] Inventors: Michael E. Hoenk, Pasadena; Paula J. Grunthaner; Frank J. Grunthaner, both of Glendale, all of Calif.

[73] Assignee: California Institute of Technology, Pasadena, Calif.

[21] Appl. No.: 905,018

[22] Filed: Jun. 26, 1992

[51] Int. Cl.⁵ .................................................. C23C 14/24
[52] U.S. Cl. .................................... 118/728; 118/503; 269/286
[58] Field of Search ................. 118/728, 503; 269/286

[56] References Cited

U.S. PATENT DOCUMENTS

| | | | |
|---|---|---|---|
| 3,796,882 | 3/1974 | Cahill | 250/211 J |
| 4,592,308 | 6/1986 | Shih | 118/728 |
| 4,877,573 | 11/1989 | Nilsson | 118/728 |
| 5,123,636 | 6/1992 | Dumler | 269/286 |

Primary Examiner—Richard Bueker
Attorney, Agent, or Firm—Robert M. Wallace; Michael L. Keller

[57] ABSTRACT

The sample holder of the invention is formed of the same semiconductor crystal as the integrated circuit on which the molecular beam expitaxial process is to be performed. In the preferred embodiment, the sample holder comprises three stacked micro-machined silicon wafers: a silicon base wafer having a square micro-machined center opening corresponding in size and shape to the active area of a CCD imager chip, a silicon center wafer micro-machined as an annulus having radially inwardly pointing fingers whose ends abut the edges of and center the CCD imager chip within the annulus, and a silicon top wafer micro-machined as an annulus having cantilevered membranes which extend over the top of the CCD imager chip. The micro-machined silicon wafers are stacked in the order given above with the CCD imager chip centered in the center wafer and sandwiched between the base and top wafers. The thickness of the center wafer is about 20% less than the thickness of the CCD imager chip. Preferably, four titanium wires, each grasping the edges of the top and base wafers, compress all three wafers together, flexing the cantilever fingers of the top wafer to accommodate the thickness of the CCD imager chip, acting as a spring holding the CCD imager chip in place.

15 Claims, 2 Drawing Sheets

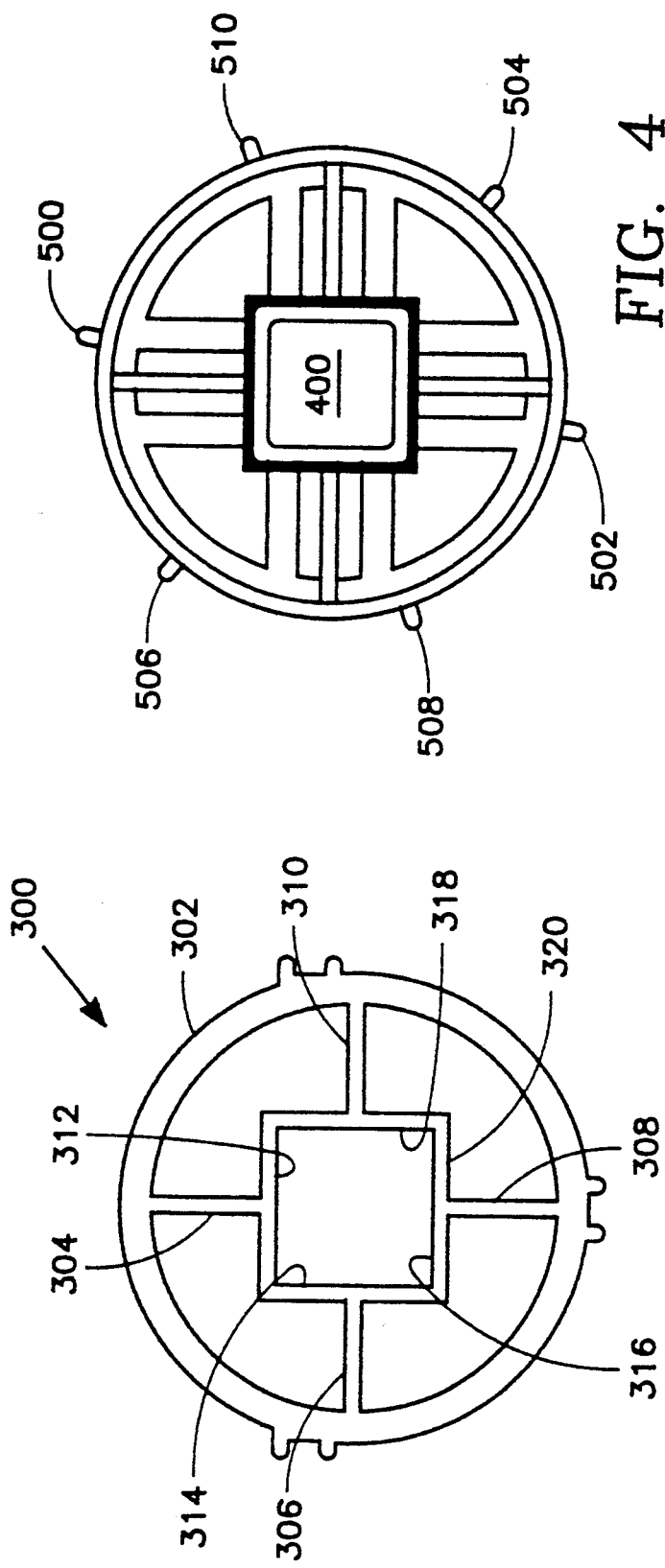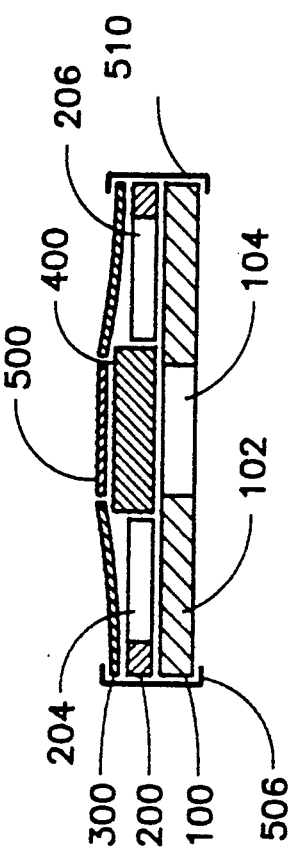

SILICON SAMPLE HOLDER FOR MOLECULAR BEAM EPITAXY ON PRE-FABRICATED INTEGRATED CIRCUITS

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Technical Field

The invention relates to the growth of epitaxial layers on semiconductor integrated circuits such as charge coupled devices, and in particular to molecular beam epitaxy of delta-doped layers onto the back surface of a already-fabricated backside-illuminated CCD.

2. Background Art

Co-pending U.S. patent application Ser. No. 07/905,012 filed Jun. 26, 1992 by Michael E. Hoenk et al. entitled "GROWTH OF DELTA-DOPED LAYERS ON SILICON CCDs FOR ENHANCED ULTRAVIOLET RESPONSE" and assigned to the present assignee discloses a process for enhancing the ultraviolet quantum efficiency of a backside-illuminated silicon CCD by growing a delta-doped epitaxial silicon layer on the back surface thereof, by molecular beam epitaxy. Generally, performing molecular beam epitaxy on an already-fabricated integrated circuit such as a CCD is problematic, as will be described now.

In the typical molecular beam epitaxy process, the work piece, a silicon wafer, is held by a sample holder in a molybdenum heater block using indium as a bonding agent. Typically, the molecular beam epitaxy process is performed prior to the deposition of metal or aluminum conductive layers, so that the process may be carried out at high temperatures without destroying the integrated circuits formed on the silicon wafer. However, if molecular beam epitaxy is to be performed on a finished integrated circuit (such as a CCD), a number of seemingly insurmountable problems are encountered.

For example, existing sample holder designs are not compatible with the requirements for MBE growth on pre-processed devices. Mounting a CCD to a molybdenum block using indium would destroy the device, and the dimensions of charge-coupled devices are incompatible with standard indium-free sample holders. Changing the dimensions of an indium-free holder may not be suitable, because of possible damage caused by locally high temperatures where molybdenum contacts the substrate. Temperatures in excess of 500 Celsius will destroy the aluminum contacts of a CCD, and heating the CCD to temperatures in the 400–500 degree Celsius range must be limited in duration. In addition, the ultra-high vacuum environment required for MBE is sensitive to contamination attributable to the sample holder, particularly in those cases in which the sample holder is formed of materials harmful to the MBE process.

What is needed is a way of holding a pre-fabricated integrated circuit such as a CCD imager chip or die without using impurities such as indium and without inducing stresses on the CCD die by localized heating (caused by incompatible heat capacities between the CCD die and the sample holder) and/or by mechanical stress (caused by incompatible thermal coefficients of expansion between the CCD die and the sample holder).

SUMMARY OF THE INVENTION

The sample holder of the invention is formed of the same semiconductor crystal as the integrated circuit on which the molecular beam expitaxial process is to be performed, which is silicon in the example given below. In the preferred embodiment, the sample holder comprises three stacked micro-machined silicon wafers: a silicon base wafer having a square micro-machined center opening corresponding in size and shape to the active area of a CCD imager chip, a silicon center wafer micro-machined as an annulus having radially inwardly pointing fingers whose ends abut the edges of and center the CCD imager chip within the annulus, and a silicon top wafer micro-machined as an annulus having cantilevered membranes which extend over the top of the CCD imager chip. The micro-machined silicon wafers are stacked in the order given above with the CCD imager chip centered in the center wafer and sandwiched between the base and top wafers. The thickness of the center wafer is about 20% less than the thickness of the CCD imager chip. Preferably, at least four titanium wires, each grasping the edges of the top and base wafers, compress all three wafers together, causing the cantilever fingers of the top wafer to elastically deform or flex to accommodate the thickness of the CCD imager chip, acting as a spring holding the CCD imager chip in place.

Preferably, the diameters of the three wafers are the same and are such as to fit within the molybdenum heating block of a Riber 32 Si MBE system, which is designed to hold two-inch wafers, although the invention is not limited to any particular set of dimensions. In the preferred embodiment, the thickness of the CCD imager chip is 500 $\mu$m, the thickness of the base and center micro-machined silicon wafers is 400 $\mu$m and the thickness of the top micro-machined silicon wafer is 200 $\mu$m. Thus, the CCD imager chip protrudes above the top of the center micro-machined wafer by 100 $\mu$m, which is the vertical displacement through which the cantilever fingers of the top wafer must flex.

Fabrication of the silicon pieces for the sample holder uses techniques developed for silicon micro-machining. The holder pieces were etched out of three-inch diameter Si wafers sliced along the crystalline 100 plane. Thermal oxides, approximately 0.5 $\mu$m thick, were grown on the wafers. Patterns for the holder design were transferred to the wafers by photolithography. The holder patterns were then etched into the oxide using a $CF_4$ plasma. An ethylene-diamine pyrocatechol solution at 100° Celsius carved the pieces out of the three inch wafers, selectively etching the silicon through the patterned oxide. Finally, the pieces were cleaned in preparation for the ultra-high vacuum environment of the MBE process.

The use of a silicon holder has several advantages. Properly cleaned prior to use, the high purity silicon holder does not contaminate either the MBE chamber or the sample during growth. The temperatures attained by the holder and the sample are similar, which minimizes local heating of the CCD by the holder. Because the thermal expansion of the holder and of the sample are the same, differential expansion and contraction between the sample and holder is not a problem. Finally, fabrication of the holder is straightforward, making it relatively easy to modify the design to conform to different sample geometries.

BRIEF DESCRIPTION OF THE DRAWINGS

FIG. 3 is a top view of the top micro-machined silicon wafer.

FIGS. 4 and 5 are top and side views, respectively, of the sample holder of the invention, including the base, center and top micro-machined wafers and illustrating how the CCD imager chip is held in place.

DETAILED DESCRIPTION OF THE INVENTION

Figure 1:
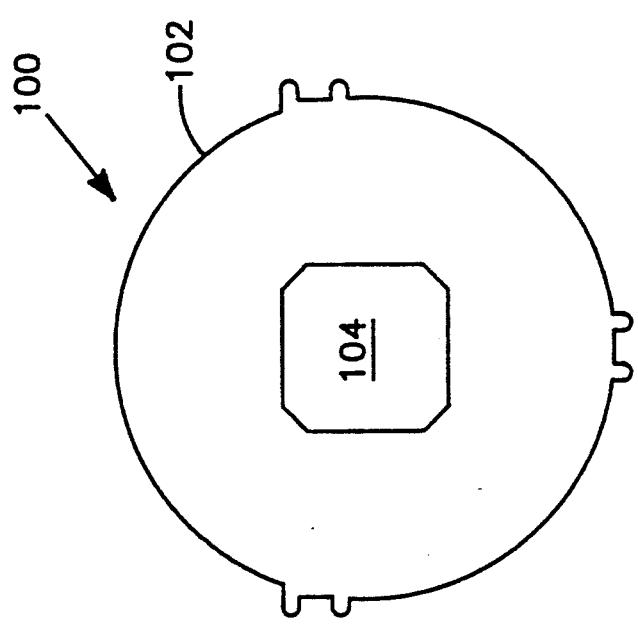
FIG. 1 is a top view of the base micro-machined silicon wafer.

Referring to FIG. 1, the base wafer 100 comprises a discoid annulus 102 having a generally square opening 104 in the center thereof. The diameter of the discoid annulus is approximately two inches while the length of each side of the square opening matches a respective side of the square active area of a Reticon CCD imager chip. The thickness of the base wafer 100 is 400 μm and is micro-machined from a three-inch Si(100) wafer.

Figure 2:
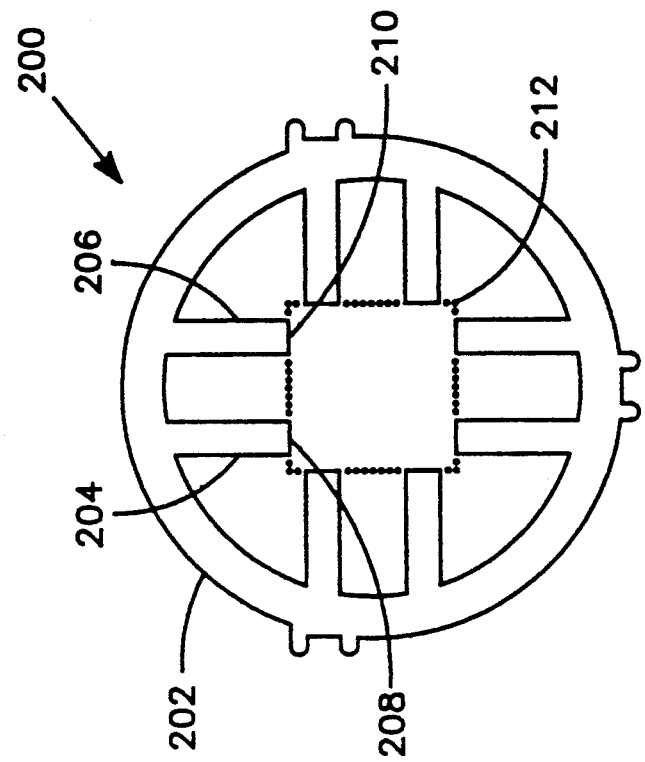
FIG. 2 is a top view of the center micro-machined silicon wafer.

Referring to FIG. 2, the center wafer 200 comprises a planar annulus 202 having an outside diameter of two inches and an inside diameter of approximately 1.8 inches. Along the inside diameter of the planar annulus 202 at 90 degree intervals, four pairs of planar fingers 204, 206 extend inwardly from the annulus 202 toward the center thereof. The fingers 204, 206 terminate at finger ends 208, 210, for a total of eight ends defining the locus of an imaginary rectangle 212 in which a Reticon CCD imager chip snugly fits. The center wafer 200 is approximately 400 μm thick and is micro-machined from a three-inch Si(100) wafer.

Referring to FIG. 3, the top wafer 300 comprises a planar annulus 302 having a two-inch outside diameter and a 1.8 inch inside diameter. Along the inside diameter at 90 degree intervals, four cantilever fingers 304, 306, 308, 310 extend radially inwardly from the annulus 302 toward the center thereof, each of the four fingers terminating in the center of a respective arm 312, 314, 316, 318 of a square planar frame 320. The outside length of the frame 320 corresponds to the length of a side of the Reticon CCD imager chip while the inside length of the frame 320 frames the active area of the Reticon CCD imager chip.

Referring to FIGS. 4 and 5, the Reticon CCD imager chip 400 is held in the plane of the center wafer 200 within the imaginary rectangle 212 sandwiched between the base and top wafers 100, 300, while six titanium holder wires 500, 502, 504, 506 compress the base and top wafers 100, 300 toward one another, forcing the cantilever fingers 304, 306, 308, 310 to flex upwardly to accommodate the 100 μm protrusion of the imager chip 400 above the top of the center wafer 200.

The assembly of FIGS. 4 and 5 is inserted into a Riber molybdenum heater block of the Riber molecular beam epitaxy system, and a delta-doped silicon epitaxial layer is grown on the back side of the imager chip 400, in accordance with the process described in the above-referenced co-pending patent application. Prior to insertion of the imager chip 400 into the assembly of FIGS. 4 and 5, the imager chip 400 is first prepared in accordance with the description of the above-referenced co-pending patent application. This preparation includes thinning the active or photosensitive central area of the imager chip, by etching the backside of the imager chip to remove a portion of the thickness thereof, and installing a protective sealant on the top surface of the CCD imager chip to protect the CCD circuit elements on the top surface. Significantly, this preparation further includes a cleaning process described in detail in the above-referenced application, which is incorporated herein by reference. The cleaning process described therein cleans the CCD imager chip back surface so that the back surface is atomically clean without raising the the CCD imager chip to a temperature at which the CCD circuit elements are damaged. This makes possible the MBE growth of an epitaxial layer on the back surface of the CCD imager chip without damage to the CCD imager chip.

The imager chip 400 is mounted so that its back surface faces towards the opening 104 in the base wafer 100, so that the thinned portion of the integrated circuit opposite the active area of the CCD receives heat and the molecular beam of the MBE process.

The growth of the delta-doped silicon epitaxial layer is accomplished by exposing the back side of the imager chip 400 to a source of evaporated silicon atoms while mounted in the assembly of FIGS. 4 and 5 inside the molybdenum heater block of the Riber molecular beam epitaxy system. Then, the silicon atom source is interrupted while the back side of the imager chip 400 is exposed to a source of atomic boron (or other suitable dopant). Finally, exposure to the silicon source is resumed to complete the expitaxial silicon growth, in accordance with the description in the above-referenced co-pending patent application.

While the invention has been described in detail by specific reference to preferred embodiments of the invention, it is understood that variations and modifications may be made without departing from the true spirit and scope of the invention.

What is claimed is:

1. Apparatus for holding an integrated circuit, said integrated circuit comprising a thin planar substrate of a particular type of semiconductor material, said apparatus comprising:

top and bottom planar plates comprising said type of semiconductor material;

means for drawing said top and bottom planar plates toward one another whereby to sandwich said planar substrate between said top and bottom planar plates.

2. The apparatus of claim 1 further comprising a middle plate comprising said type of semiconductor material sandwiched between said top and bottom plates and surrounding said planar substrate whereby to center said planar substrate with respect to said top and bottom plates.

3. The apparatus of claim 2 wherein said means for drawing said top and bottom plates toward one another fastens to outer edges of said top and bottom plates and wherein said center plate has a thickness less than that of said planar substrate, whereby said means for drawing causes said top plate to elastically deform upwardly by a distance corresponding to a difference between the thicknesses of said center plate and said planar substrate.

4. The apparatus of claim 3 wherein said bottom, center and top plates comprise discs micro-machined from semiconductor wafers.

5. The apparatus of claim 4 wherein the disc of said bottom plate has an opening in the center thereof corresponding in shape and size to an optically active area of said integrated circuit.

6. The apparatus of claim 5 wherein the disc of said center plate comprises an open area in the center thereof including edge surfaces terminating at locii corresponding an outer edge of said planar substrate.

7. The apparatus of claim 6 wherein the disc of said top plate comprises an open area in the center thereof and planar fingers extending into said opening, said planar fingers being elastically deformed whenever said means for drawing draws said top and bottom plates toward one another with said planar substrate sandwiched therebetween.

8. Apparatus for holding an imager chip, said imager chip comprising a planar substrate having a thinned back side and electronic circuit elements formed on its front side, for molecular beam epitaxial growth on said back side of a doped semiconductor layer of the same type of semiconductor material as said imager chip within a chamber of a molecular beam epitaxy system, said apparatus comprising:
 a base plate for supporting said imager chip, said base plate formed purely of said type of semiconductor material.

9. The apparatus of claim 8 further comprising:
 a top plate formed purely of said type of semiconductor material;
 means for drawing said top and base plates toward one another whereby to sandwich said planar substrate between said top and bottom planar plates.

10. The apparatus of claim 9 further comprising a middle plate comprising said type of semiconductor material sandwiched between said top and base plates and surrounding said planar substrate whereby to center said planar substrate with respect to said top and base plates.

11. The apparatus of claim 10 wherein said means for drawing said top and bottom plates toward one another fastens to outer edges of said top and base plates and wherein said center plate has a thickness less than that of said planar substrate, whereby said means for drawing causes at least portions of said top plate to elastically deform upwardly by a distance corresponding to a difference between the thicknesses of said center plate and said planar substrate.

12. The apparatus of claim 11 wherein said bottom, center and top plates comprise discs micro-machined from semiconductor wafers.

13. The apparatus of claim 12 wherein the disc of said bottom plate has an opening in the center thereof corresponding in shape and size to an optically active area of said integrated circuit.

14. The apparatus of claim 13 wherein the disc of said center plate comprises an open area in the center thereof including edge surfaces terminating at locations corresponding to an outer edge of said planar substrate of said integrated circuit.

15. The apparatus of claim 14 wherein the disc of said top plate comprises an open area in the center thereof and planar fingers extending into said opening, said planar fingers being elastically deformed whenever said means for drawing draws said top and bottom plates toward one another with said planar substrate sandwiched therebetween.

* * * * *